US006830176B2

(12) United States Patent
Sinkunas et al.

(10) Patent No.: US 6,830,176 B2
(45) Date of Patent: Dec. 14, 2004

(54) SYSTEM AND METHOD FOR REPAIRING FLEX CIRCUITS

(75) Inventors: Peter Joseph Sinkunas, Canton, MI (US); Zhong-You Shi, Ann Arbor, MI (US); Jay D. Baker, Dearborn, MI (US); Robert Edward Belke, West Bloomfield, MI (US); Charles Frederick Schweitzer, Northville, MI (US); Raymond Eric Foster, Detroit, MI (US); Stephen Edward Fuks, Ann Arbor, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 246 days.

(21) Appl. No.: 10/061,599

(22) Filed: Feb. 1, 2002

(65) Prior Publication Data

US 2003/0146018 A1 Aug. 7, 2003

(51) Int. Cl.[7] .................. B23K 31/00; B23K 26/00; H05K 1/00
(52) U.S. Cl. .................. 228/119; 219/121.64; 174/254; 439/44
(58) Field of Search .................. 228/119, 191, 228/264, 245, 246, 254; 219/121.63, 121.64; 174/254; 439/44–45, 48, 65; 361/749

(56) References Cited

U.S. PATENT DOCUMENTS

| 3,505,144 A | | 4/1970 | Kilduff et al. |
| 4,418,239 A | | 11/1983 | Larson et al. |
| 4,438,561 A | * | 3/1984 | Mueller ........................ 29/831 |
| 4,700,044 A | * | 10/1987 | Hokanson et al. ..... 219/121.63 |
| 4,806,106 A | * | 2/1989 | Mebane et al. ................ 439/77 |
| 6,193,544 B1 | | 2/2001 | McGiinnis |
| 6,274,819 B1 | * | 8/2001 | Li et al. ...................... 174/254 |
| 6,284,998 B1 | | 9/2001 | Sinkunas et al. |
| 6,601,292 B2 | * | 8/2003 | Li et al. ........................ 29/829 |
| 2001/0035301 A1 | * | 11/2001 | Li et al. ...................... 174/261 |
| 2003/0146018 A1 | * | 8/2003 | Sinkunas et al. ........... 174/254 |

FOREIGN PATENT DOCUMENTS

| DE | 100 20 761 A1 | 11/2001 |
| GB | WO 01/17321 A1 * | 3/2001 |
| JP | 1000-4248 | 1/1998 |

OTHER PUBLICATIONS

IBM Technical Disclosure Bulletin NN9504479 (Apr. 1, 1995).*
IBM Technical Disclosure Bulletin NA9008213 (Aug. 1, 1990).*
English Abstract of German Pat. No. 100 20 761 A1.
English Abstract of Japanese Pat. No. 1000–4248.

* cited by examiner

Primary Examiner—Kiley Stoner
(74) Attorney, Agent, or Firm—Brinks Hofer Gilson & Lione

(57) ABSTRACT

A new system and method for repairing flexible circuits is disclosed. The flexible circuits conduct electrical signals to and from electronic devices. The system generally includes a flexible circuit substrate, at least one electrical conductor, and a repair patch. The flexible circuit substrate has a cut zone and a repair zone. The at least one electrical conductor is supported by the flexible circuit substrate. The electrical conductors are configured to carry electrical signals. The repair patch is used to electrically interconnect at least two repair zones.

21 Claims, 17 Drawing Sheets

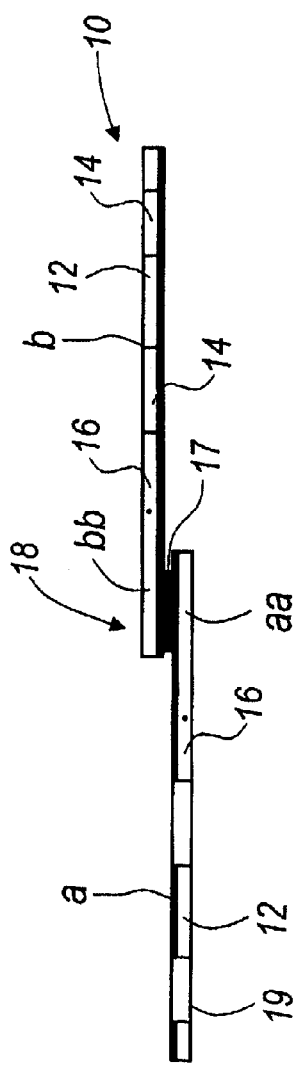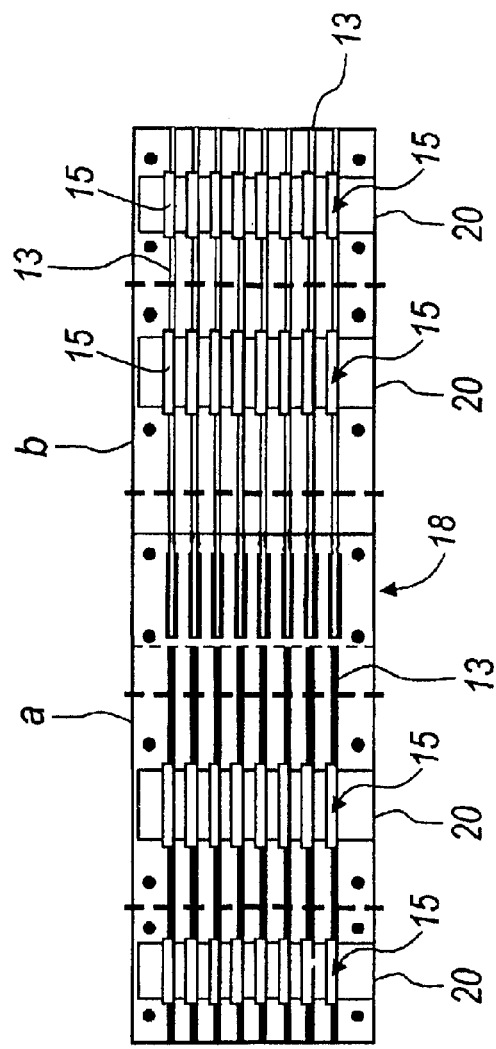

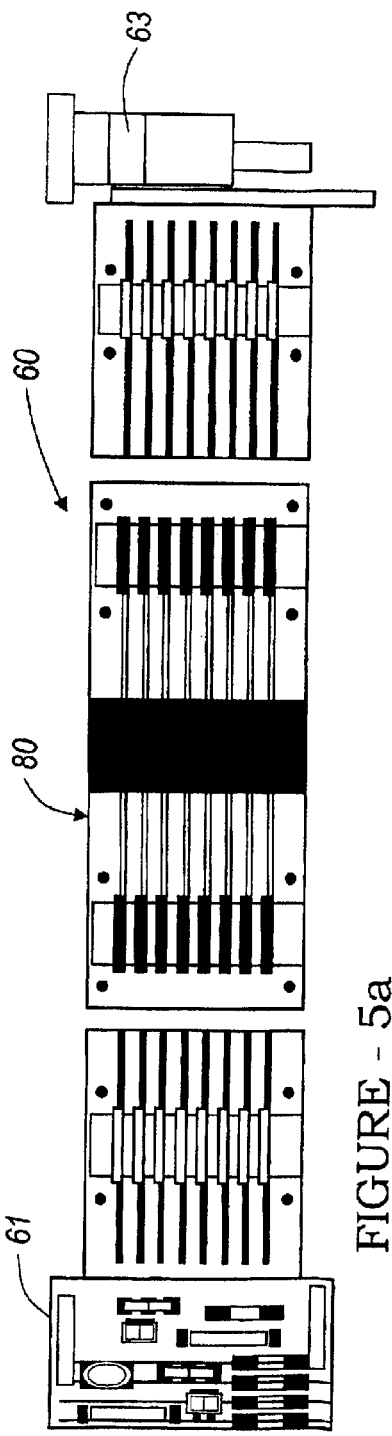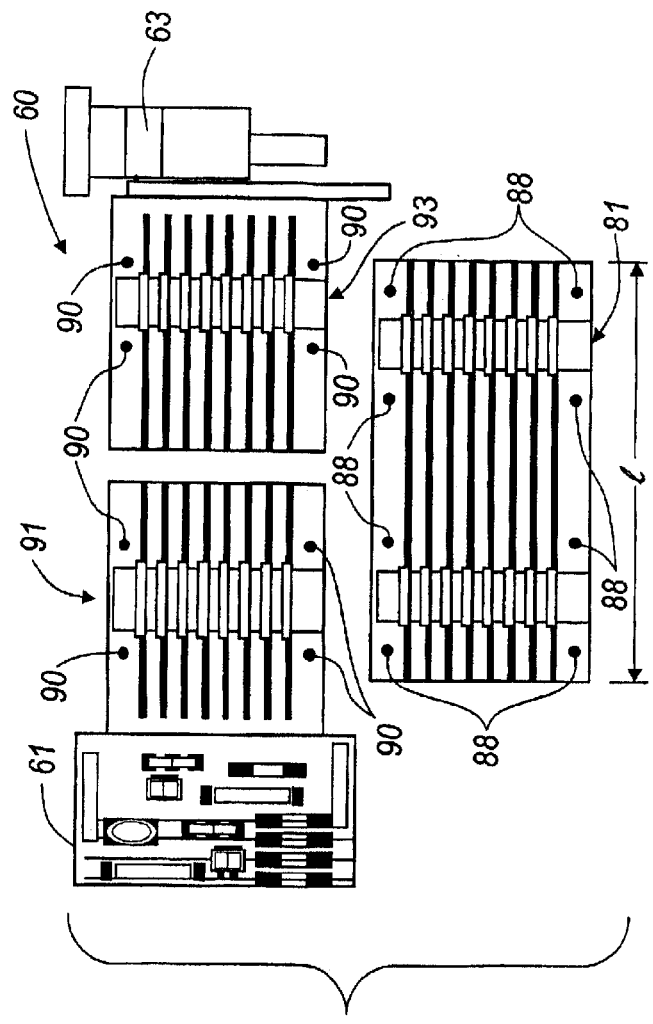
FIGURE - 5a
FIGURE - 5b

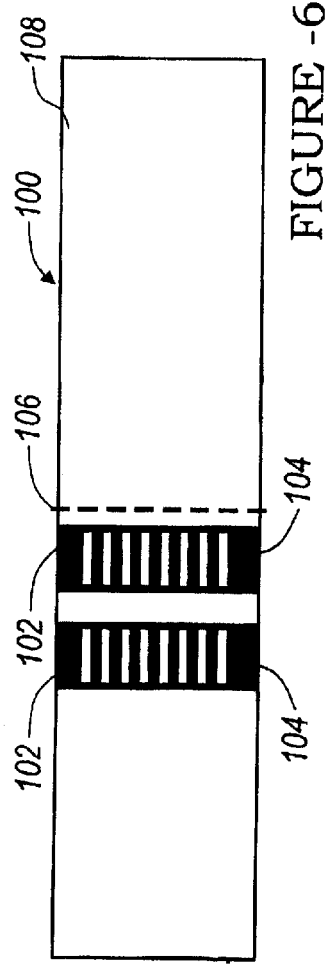
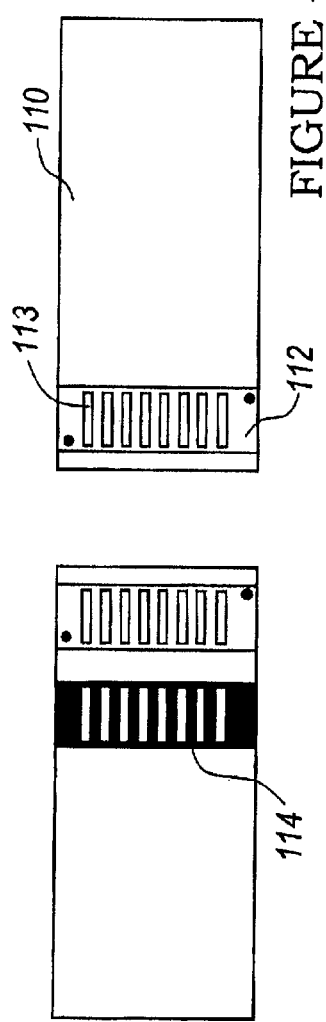
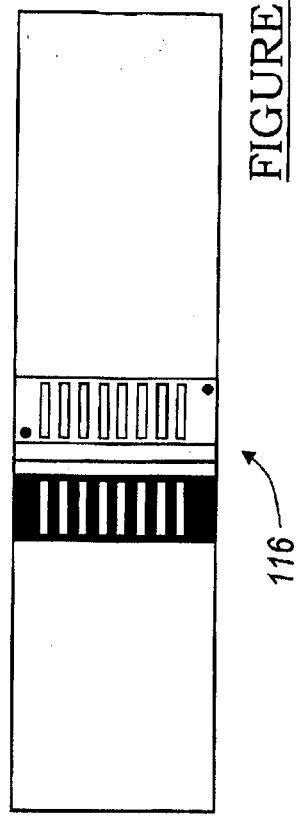

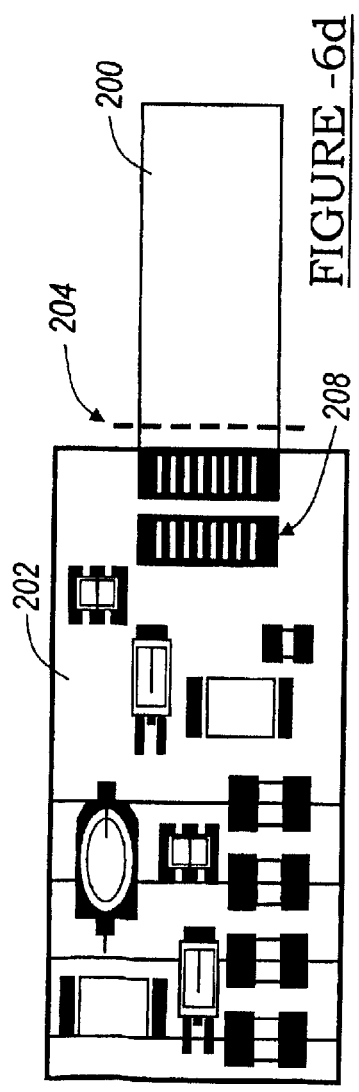
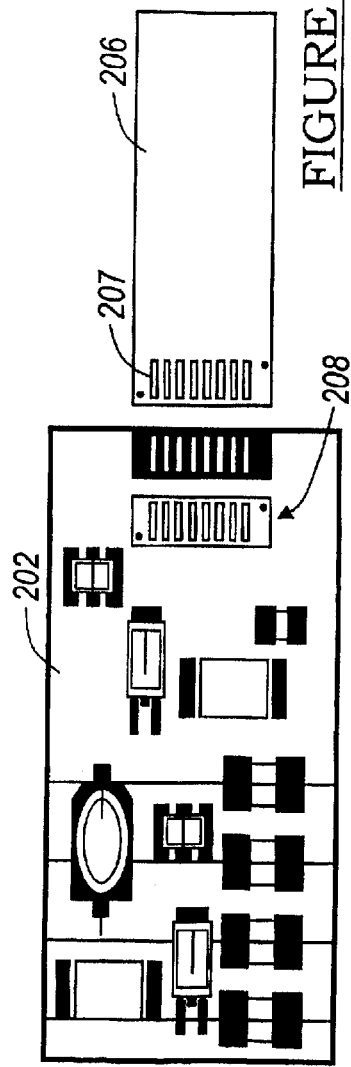
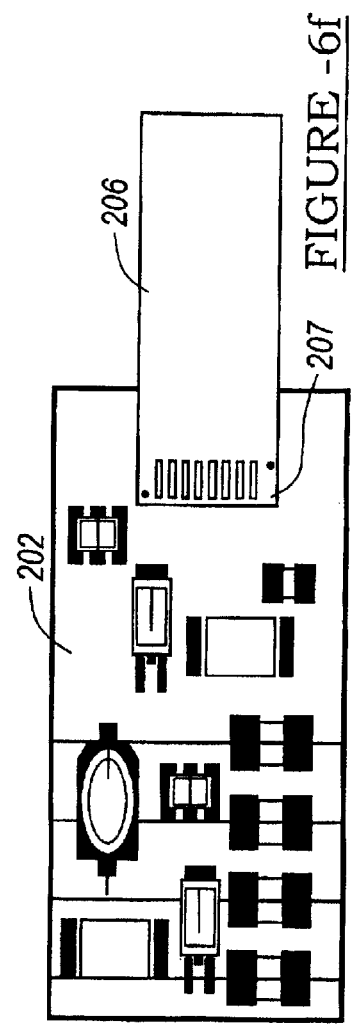
FIGURE -6d
FIGURE -6e
FIGURE -6f

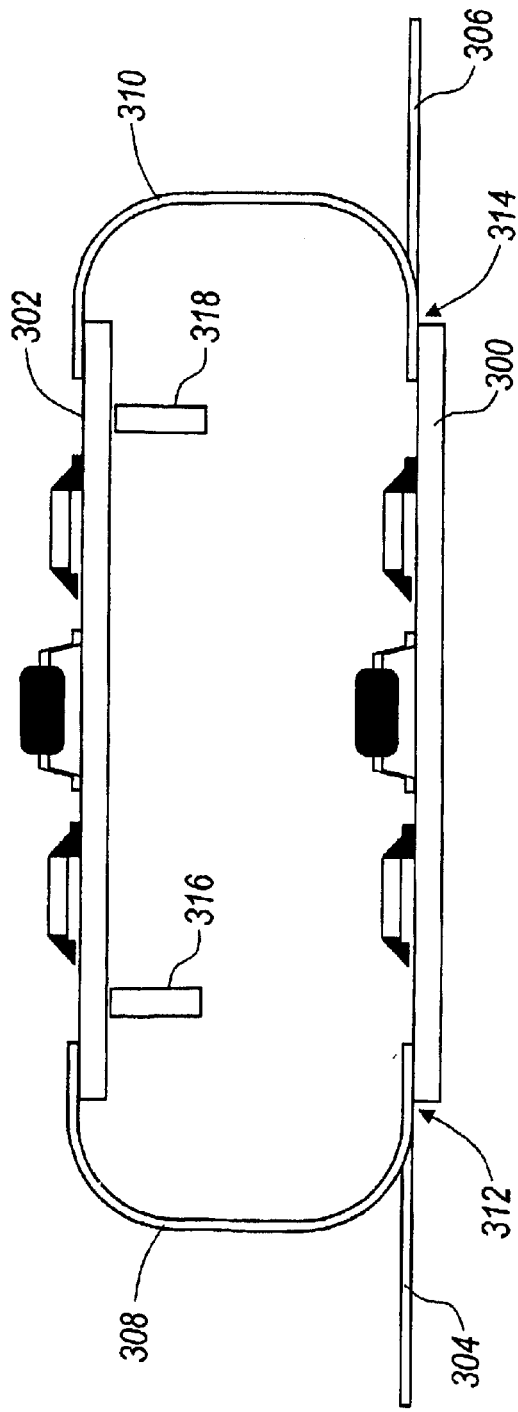
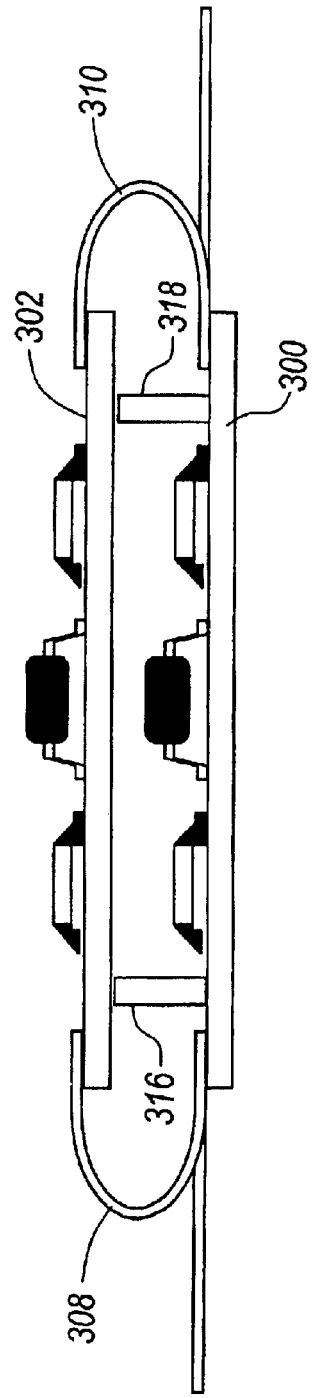
FIGURE -7a
FIGURE -7b

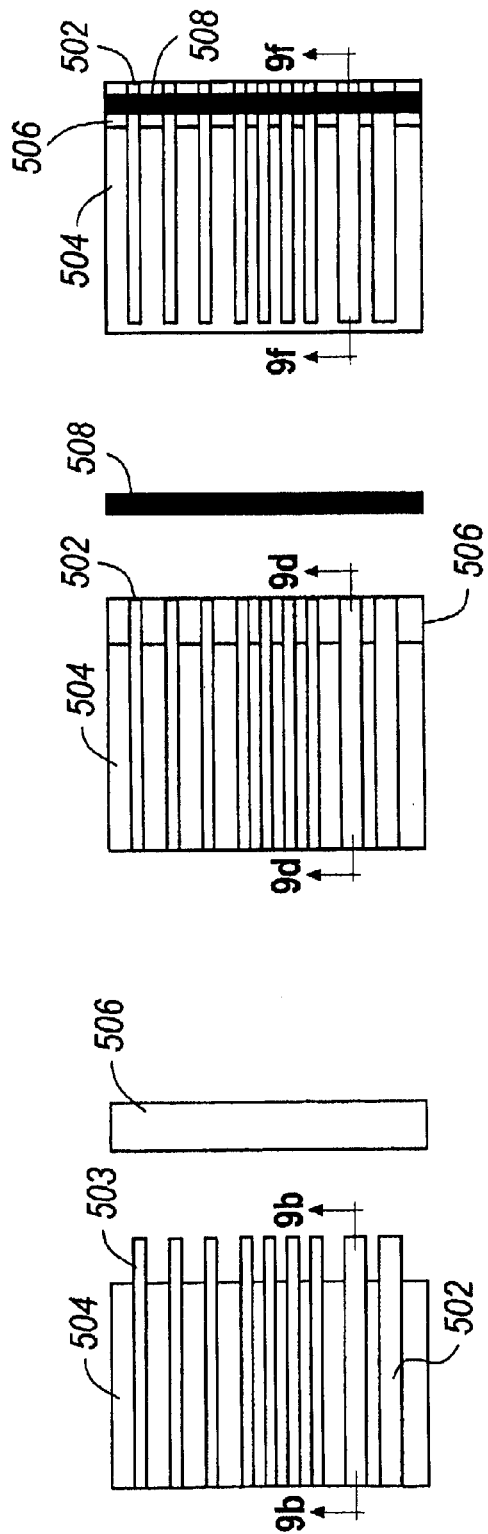
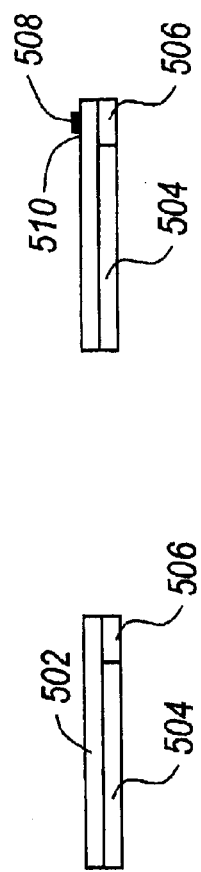
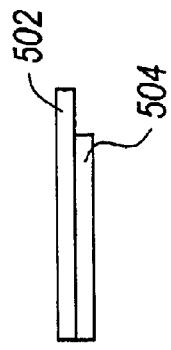
FIGURE -9e
FIGURE -9f
FIGURE -9c
FIGURE -9d
FIGURE -9a
FIGURE -9b

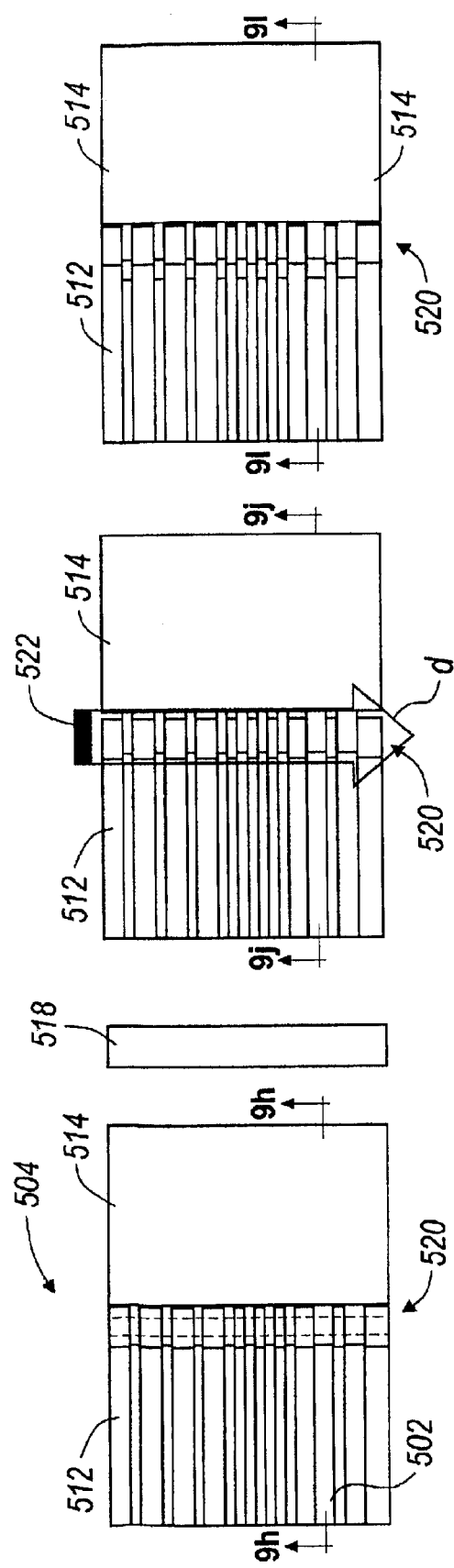
FIGURE -9g
FIGURE -9i
FIGURE -9k
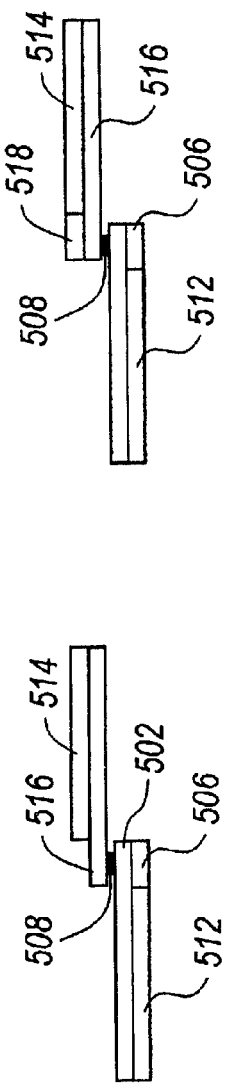
FIGURE -9h
FIGURE -9j
FIGURE -9l

SYSTEM AND METHOD FOR REPAIRING FLEX CIRCUITS

TECHNICAL FIELD

The present invention is related to flexible circuits and to systems and methods for repairing the flexible circuits.

BACKGROUND OF THE INVENTION

Flexible circuits are typically constructed of a polyester substrate and having conductive traces and electronic devices mounted thereon. While these flexible circuits have many advantages and have been implemented on many vehicles today, some problems have arisen. For example, repairing flex circuit in the field is not an easy process especially when polyester based materials are involved. Special care needs to be taken by the field technician to make a repair to a flexible circuit, such as those having polyester substrates to ensure the integrity of the flexible circuit.

Therefore there is a need for a new and improved system and method for repairing flexible circuits. The new and improved system and method should prevent the degradation of the substrate of the flexible circuit. Further, the new and improved system and method should provide new solder interconnects that are reliable and sustain the integrity of the flex circuit.

BRIEF SUMMARY OF THE INVENTION

In an aspect of the present invention a new system and method for repairing flexible circuits is provided. The flexible circuits conduct electrical signals to and from electronic devices. Furthermore, the system includes a flexible circuit substrate, at least one electrical conductor, and a repair patch. The flexible circuit substrate has a cut zone and a repair zone. The at least one electrical conductor is supported by the flexible circuit substrate. The electrical conductors are configured to carry electrical signals. The repair patch is used to electrically interconnect at least two repair zones.

BRIEF DESCRIPTION OF THE DRAWINGS

FIGS. 1a–b are a side plan views of a flat flex cable, in accordance with the present invention;

FIGS. 5a–5b is a plan view of a repair patch and flat flex cable assembly for repairing a circuit board and sensor assembly a second time after an initial repair was made, in accordance with the present invention;

FIGS. 6a–6c are plan views of flat flex cables or busses having repair zones for electrically interconnecting same, in accordance with the present invention;

FIGS. 6d–6f are a plan views of a flat flexible cable and circuit board assemblies having repair sites for repairing the assemblies, in accordance with the present invention;

FIGS. 7a–7b are side views of a flat flex cable and circuit board assemblies for repairing damaged or nonfunctional circuit boards or circuit substrates, in accordance with the present invention;

FIGS. 9a–9l are plan and cross-sectional views of a flat flex cable illustrating a method for electrically interconnecting to separate flat flex cables having exposed conductors, in accordance with the present invention;

DETAILED DESCRIPTION OF THE INVENTION

Figure 2:
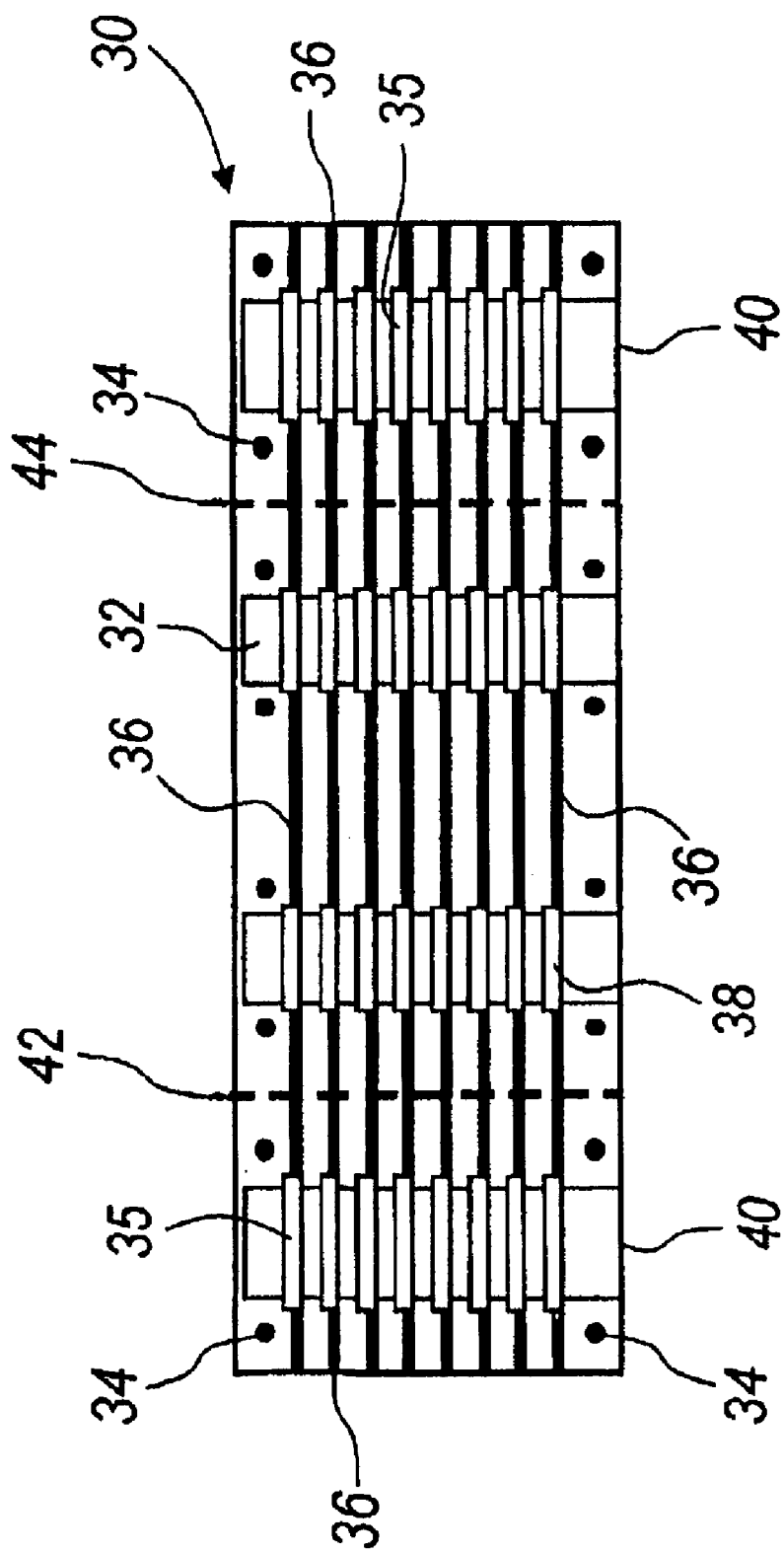
FIG. 2 is a plan view of a repair patch configured, in accordance with the present invention.

Referring now to FIGS. 1a through 1b a flat flex cable (FFC) 10 is illustrated, in accordance with an aspect of the present invention. A side view of flat flex cable 10 is illustrated in FIG. 1a, as shown FFC 10 includes a flexible circuit substrate 12 and a plurality of electrical conductors 13. FFC 10 further includes exposed conductor regions 14 and insulated conductor regions 16. In an embodiment of the present invention two separate portions (a) and (b) of a flat flexible cable are metallurgically interconnected using solder paste 17 disposed within a lap joint 18.

A plan view of flat flex cable 10 is further illustrated in FIG. 1b. As shown, a plurality of repair zones 20 are spaced, in one embodiment, uniformally apart from each other and, in another embodiment, non-uniformally apart. Repair zones 20 include conductors 13 which are not electrically insulated within the repair zone. Moreover, a solder paste 15 is pre-formed and disposed over the exposed conductor traces 13. Lap joint 18 is constructed by overlapping a section (aa) over a section (bb) on portion (a) and (b) respectively of FFC 10. The lap joint 18 is then heated to liquefy the solder. Techniques for heating solder paste 15 without damaging substrate 12 will be described hereinafter.

Figure 3A:
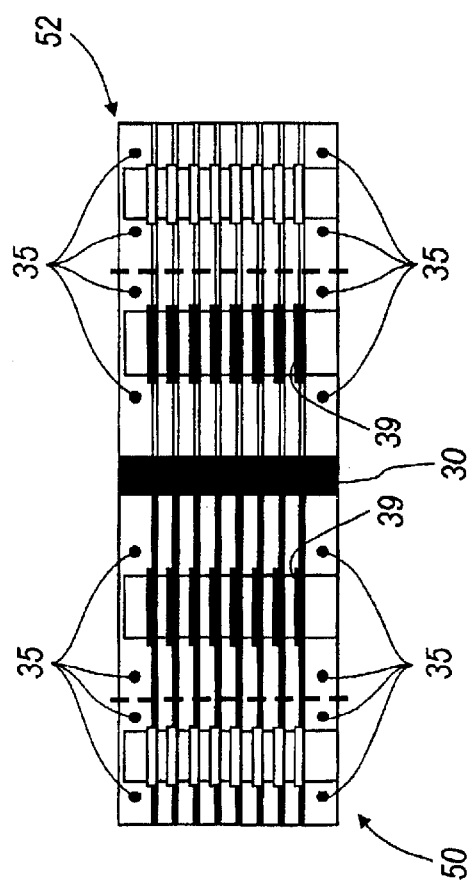
FIGS. 3a–b are a plan and side views of a flat flexible cable and repair patch assembly, in accordance with the present invention.

With continuing reference to FIG. 2, a plan view of a repair patch 30 is illustrated, in accordance with the present invention. Repair patch 30 is utilized to join two separate flat flex cables 50 and 52 (shown in FIGS. 3a and 3b). Repair patch 30 includes a substrate 32 wherein a plurality of alignment apertures 34 are disposed. Apertures 34 cooperate with alignment apertures 35 (shown in FIG. 3a) disposed in the flat flex cables 50 and 52 to facilitate alignment of repair patch 30 therewith. Further, repair patch 30 includes a plurality of conductor traces 36 for conducting electrical signals therethrough. A solder pre-forms 38 are disposed on conductors 36 for electrically interconnected patch 30 FFC's 50 and 52 as shown in FIG. 3b.

In an alternative embodiment of the present invention, repair patch 30 includes additional repair regions 40. Additional repair regions 40 have solder pre-forms 35 disposed on electrical conductors 36. These additional repair regions 40 may similarly be electrically interconnected FFC's 50 and 52 when additional electrical interconnects are desired. Repair patch 30 further includes cut lines 42 and 44 for removing the additional repair regions 40 when additional electrical interconnects are not desired.

Figure 3B:
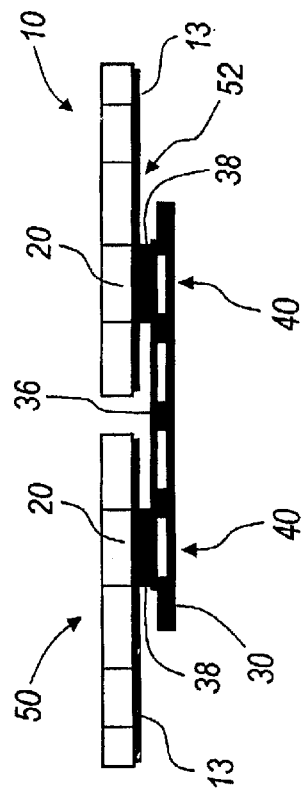

Referring now to FIG. 3b a side view of FFC's 50 and 52 and electrically interconnected patch 30 is illustrated, in accordance with the present invention. Typically, a FFC has an inoperable portion removed, thus FFC 50 and FFC 52. In operation, the present invention electrically and mechanically joins FFC 50 and FFC 52 using repair patch 30. As previously discussed, repair patch 30 includes conductors 36 having solder pre-forms 38 within the repair regions. The solder pre-forms 39 on the repair patch are aligned with solder pre-forms 15 disposed in the repair zones 20 on FFC 50 and 52. In this manner, the present invention repairs inoperable portions of a flat flexible circuit substrate.

Referring now to FIGS. 4a through 4e, a method for repairing a flat flexible circuit 60 will be described, in accordance with the present invention. FFC 60 is connected to a circuit board 61 at a first end 62 and to a sensor 63 at a second end 64. FFC 60 is configured to conduct electrical signals through a plurality of circuit conductors 66 disposed on a surface 68 of FFC 60. When a repair to FFC 60 is required due to sensor failure, circuit board failure, and/or conductor failure, or the requirement to upgrade the sensor and circuit board themselves, FFC 60 is cut along a repair cut line 70. A plurality of repair cut lines 70 are disposed on FFC 60 allowing FFC 60 to be severed closer to the sensor or closer to the circuit board.

Figure 4A:
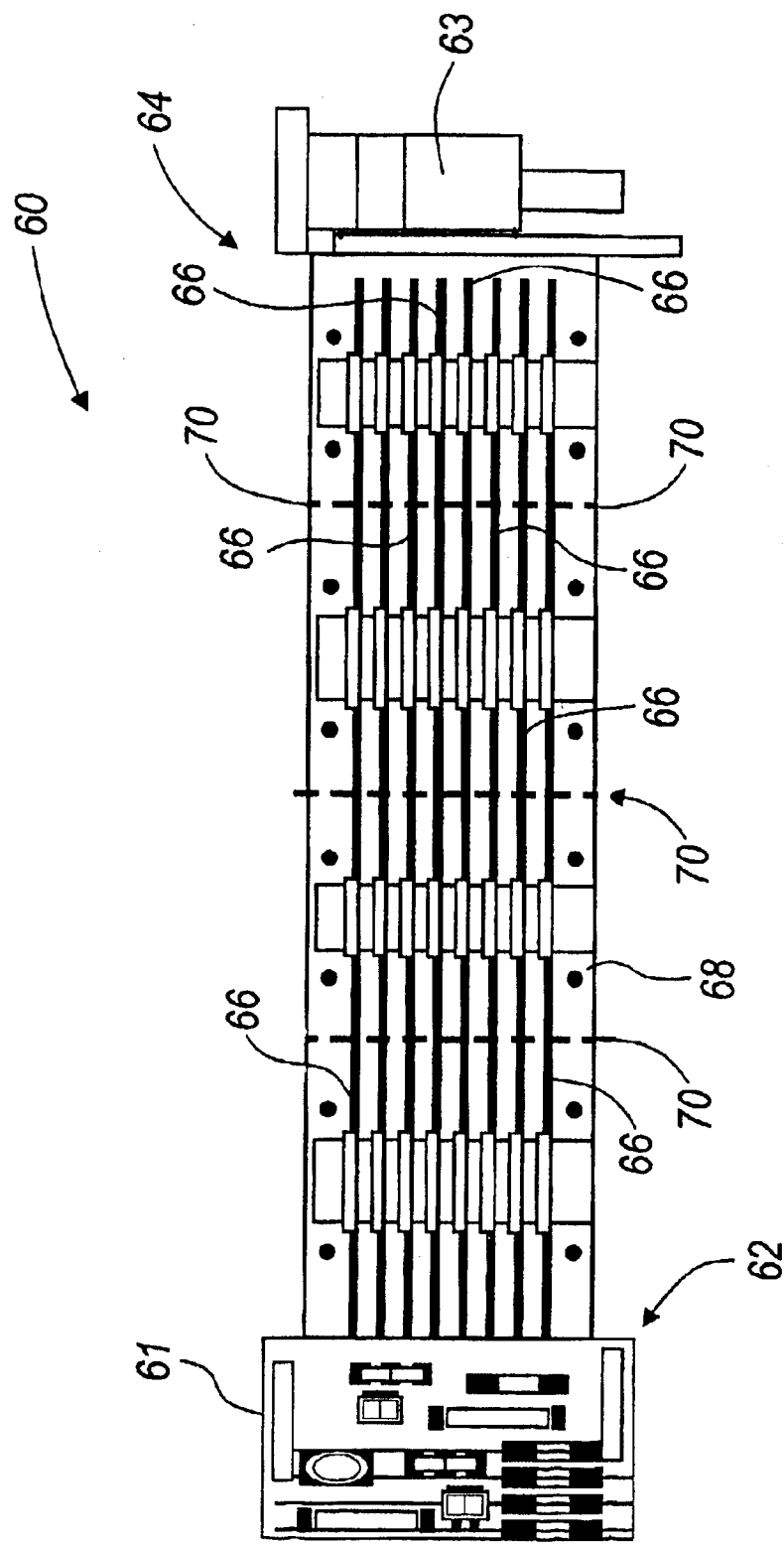
FIG. 4a is a plan view of a flat flex cable assembly that needs to be repaired, in accordance with the present invention.
Figure 4B:
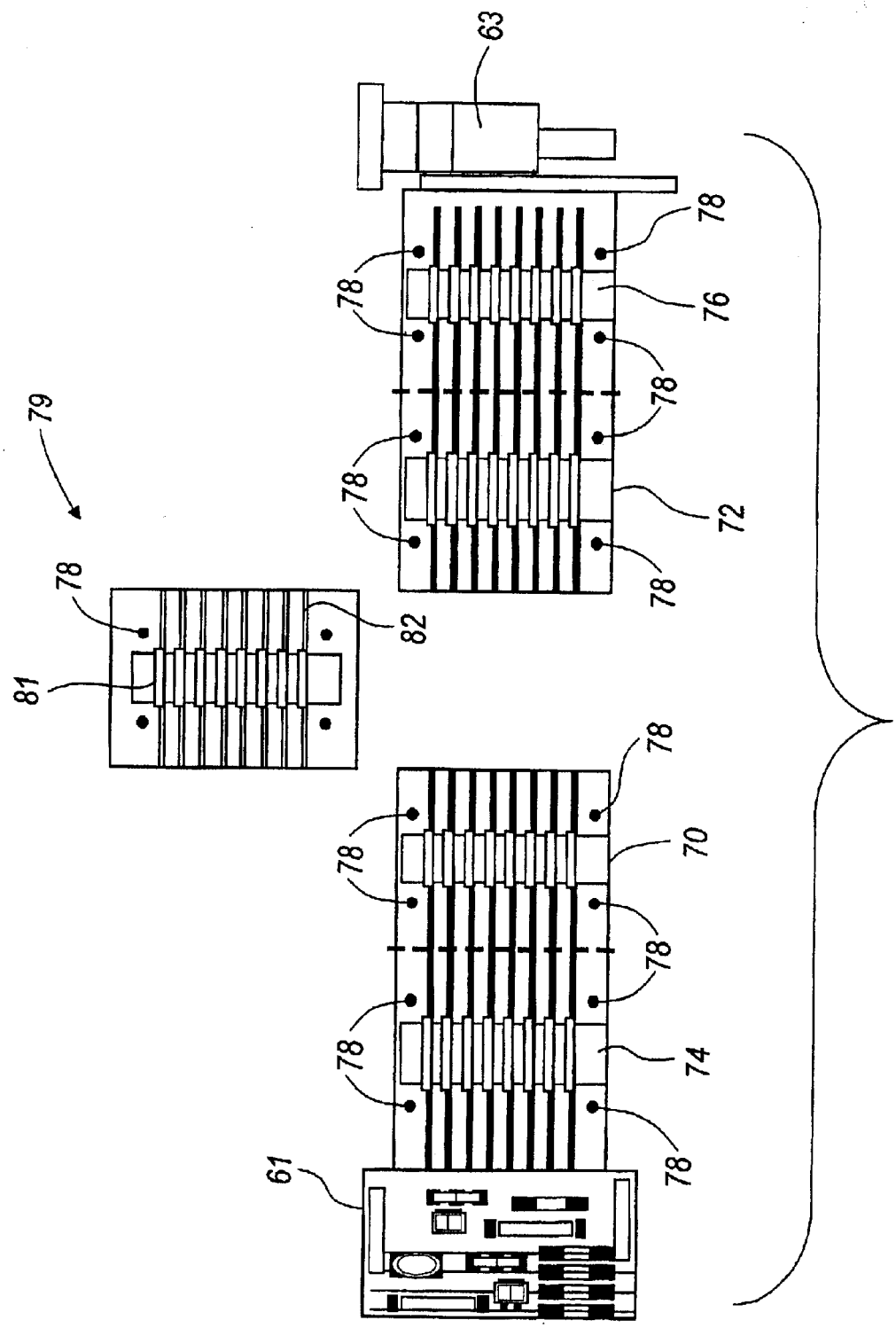
FIG. 4b is a plan view of a repair patch and flat flex cable assembly positioned to electrically interconnect with the repair patch, in accordance with the present invention.

Referring now to FIG. 4b, the FFC 60 and circuit board sensor assembly is further illustrated after FFC 60 has been severed along cut line 70. Additional repair zones 74 and 76 are also present on FFC 60 and are identical to repair zones 70 and 72, however they are located closer to the circuit board and to the sensor respectively. Repair zones 70, 72, 74 and 76 include a plurality of alignment holes or apertures 78 to facilitate alignment of FFC 60 with a repair patch 79, as will be further illustrated below. Further, repair patch 79 includes solder paste pre-forms 81 which are deposited over the conductor traces 82.

Figure 4C:
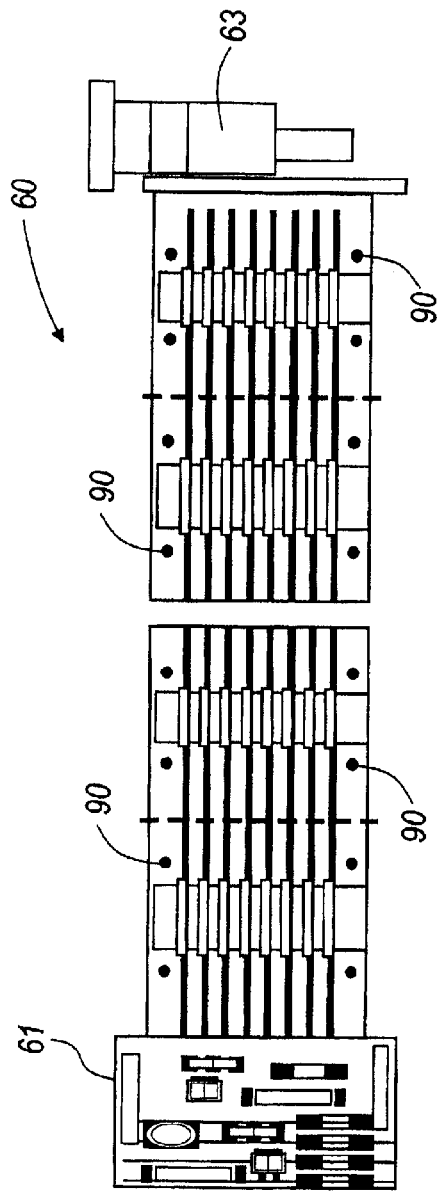
FIGS. 4c–4e is a plan view of another embodiment of a repair patch and flat flex cable assembly positioned for electrical interconnection, in accordance with the present invention.
Figure 4E:
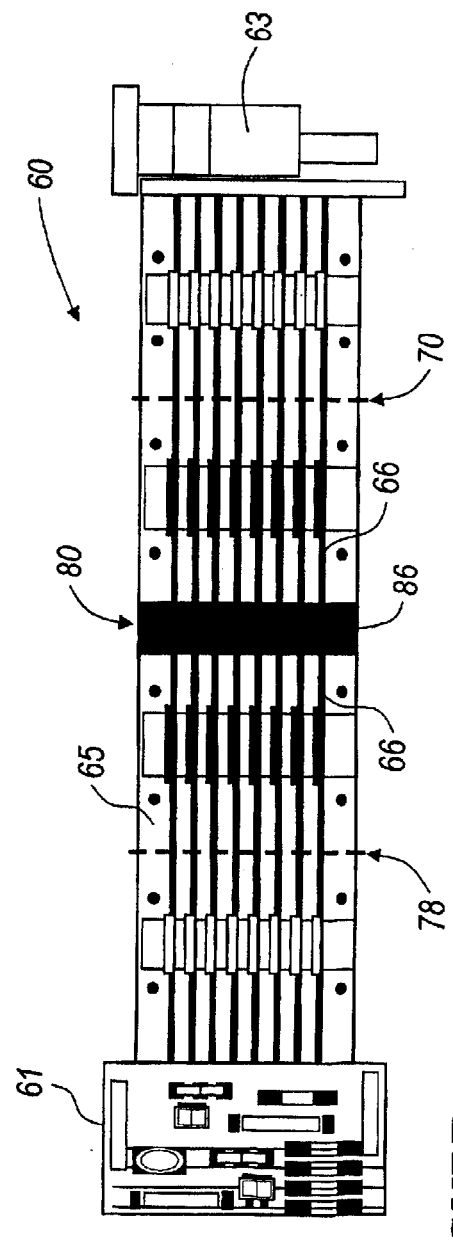
Figure 4D:
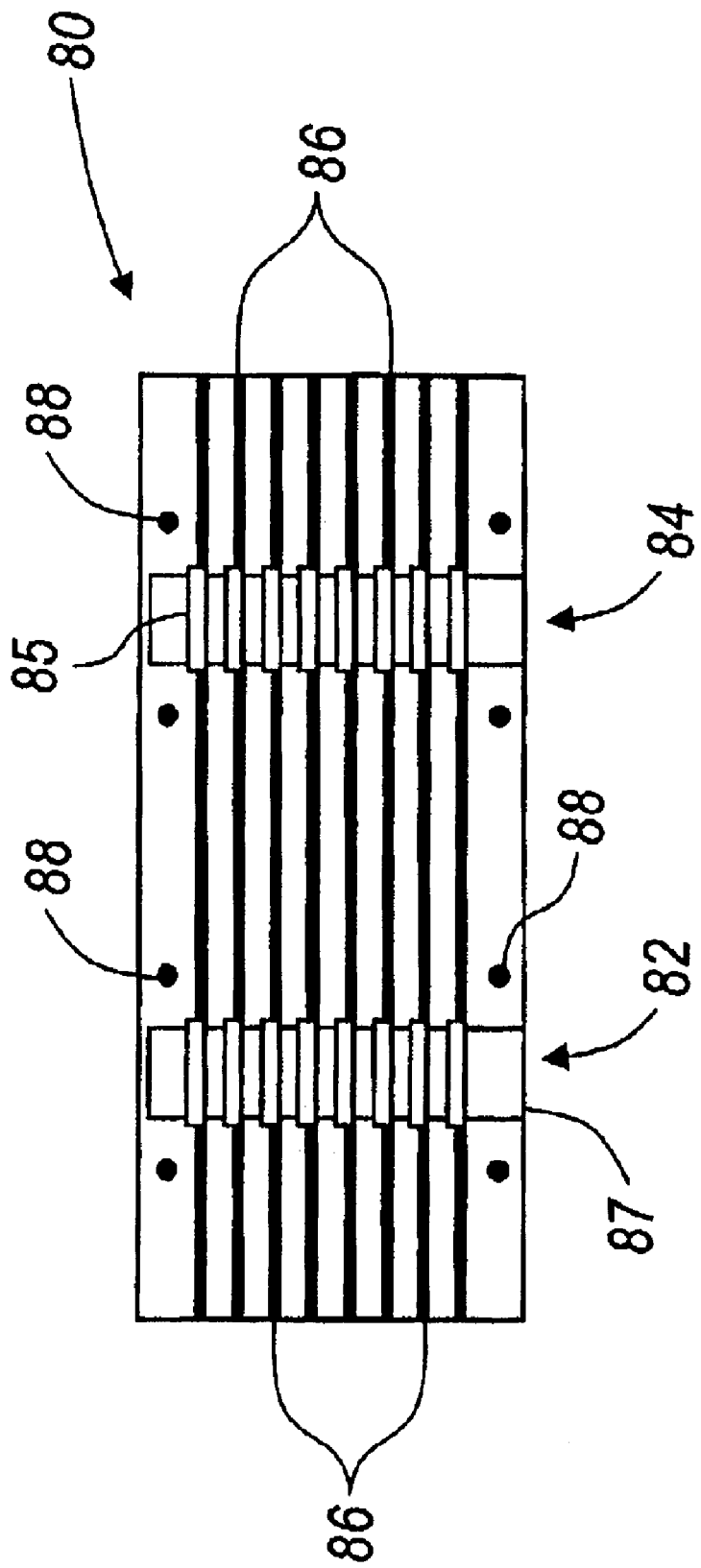

As illustrated in FIGS. 4c through 4e, FFC 60 is alternatively electrically interconnected using a repair patch 80. Repair patch 80 has at least two repair zones 82 and 84. Repair zones 82 and 84 include solder paste pre-forms 85 and 87 applied over conductive traces 86. A plurality of alignment apertures 88 are also provided on patch 80 and cooperate with alignment apertures 90 disposed on the substrate 65 of FFC 60 to ensure proper alignment of conductive traces 86 on repair patch 80 with the conductive traces 66 on FFC 60.

A fully assembled flex patch 80 and FFC 60 assembly is illustrated in FIG. 4e. As shown, patch 80 and traces 86 disposed thereon are accurately aligned with traces 66 disposed on FFC 60. In this way, FFC 60 is repaired and electrical signals may be transmitted from circuit board 61 to sensor 63 through the substrate 65, patch 80 assembly.

Referring now to FIGS. 5a and 5b, FFC 60 is shown again to demonstrate a method for repairing the circuit board 61 and sensor 63 assembly a second time after an initial repair (as described above) was made. In operation the previous repair patch 80 is removed by cutting the patch along repair cut lines 70 and 78 shown in FIG. 4e. A new repair patch 81 is aligned with the two cut portions 91 and 93 of FFC 60 using alignment apertures 88 in repair patch 81 and alignment apertures 90 in portions 91 and 93 of FFC 60. Of course, the length (l) of the repair patch 81 may be any length suitable for a given application.

Referring now to FIGS. 6a–6f, plan views of flexible cables or busses 100 are illustrated. Flex cables 100 in one embodiment include jumper repair sites 102 having solder pre-forms 104 disposed over conductive traces and thus in electrical communication therewith. Typically, a plurality of jumper repair sites are present on flat flex cable 100 for repairing the cable. In operation, flat flex cable 100 is severed along a cut line 106. Once the flex cable 100 is severed a damaged portion 108 is removed and a flat flex cable repair portion 110 having a repair jumper 112 is electrically interconnected to the remaining portion 114 of flat flex cable 100. Repair jumper 112 is in electrical communication with repair portion 110 through solder performs 113 dispersing thereon. Repair portion 110 is electrically interconnected with repair jumpers 112 by overlaying repair portion 110 over portion 114 to form a lap joint 116, as shown in FIG. 6c.

Referring now to FIGS. 6d–6f, a plan view of a FFC 200 connected to a circuit board 202 is illustrated, in accordance with an embodiment of the present invention. FFC 200 includes a cut line 204 for severing FFC 200 from circuit board 202. For example, when a replacement FFC 206 is needed to replace FFC 200 when cable 200 is damaged. Replacement FFC 206 includes a repair site or zone 257 having solder paste (preferably pre-formed) over conductive traces (not shown). At least one jumper repair site 208 is present on circuit board 202 for attaching repairable FFC 206 thereto. Jumper repair site 208 is generally covered by a pealable tape when not in use. The tape is then easily removed and FFC 206 is placed over jumper repair site 208 on circuit board 202. As will be described below a method for reflowing the solder between the jumper repair site 208 and the repair zone 207 on FFC 210 will be described. As illustrated in FIG. 6f, the final repaired circuit board 202 and FFC 206 is assembled. Thus, the present invention allows a damaged FFC to be removed and an operable FFC to be electrically interconnected to circuit board 202.

In yet another embodiment of the present invention, a system and method for repairing damaged or nonfunctional circuit boards or circuit substrates or upgrading existing circuit boards or circuit substrates is illustrated in FIGS. 7a and 7b. For example, if a circuit substrate and/or circuit board 300 becomes inoperable, a new operable circuit substrate and/or circuit board 302 may be used to replace inoperable circuit substrate board 300. In operation new substrate 302 is secured to existing flat flex cables 304 and 306 using the methods described above. New circuit substrate 302 includes flat flex repair cables 308 and 310 which are interconnected electrically via solder at lap joints 312 and 314. A pair of stand offs 316 and 318 are exposed under new circuit substrate 302. Stand offs 316 and 318 provide appropriate spacing between the new substrate 302 and the inoperable substrate 300. The final assembly is illustrated in FIG. 7b.

Figure 8:
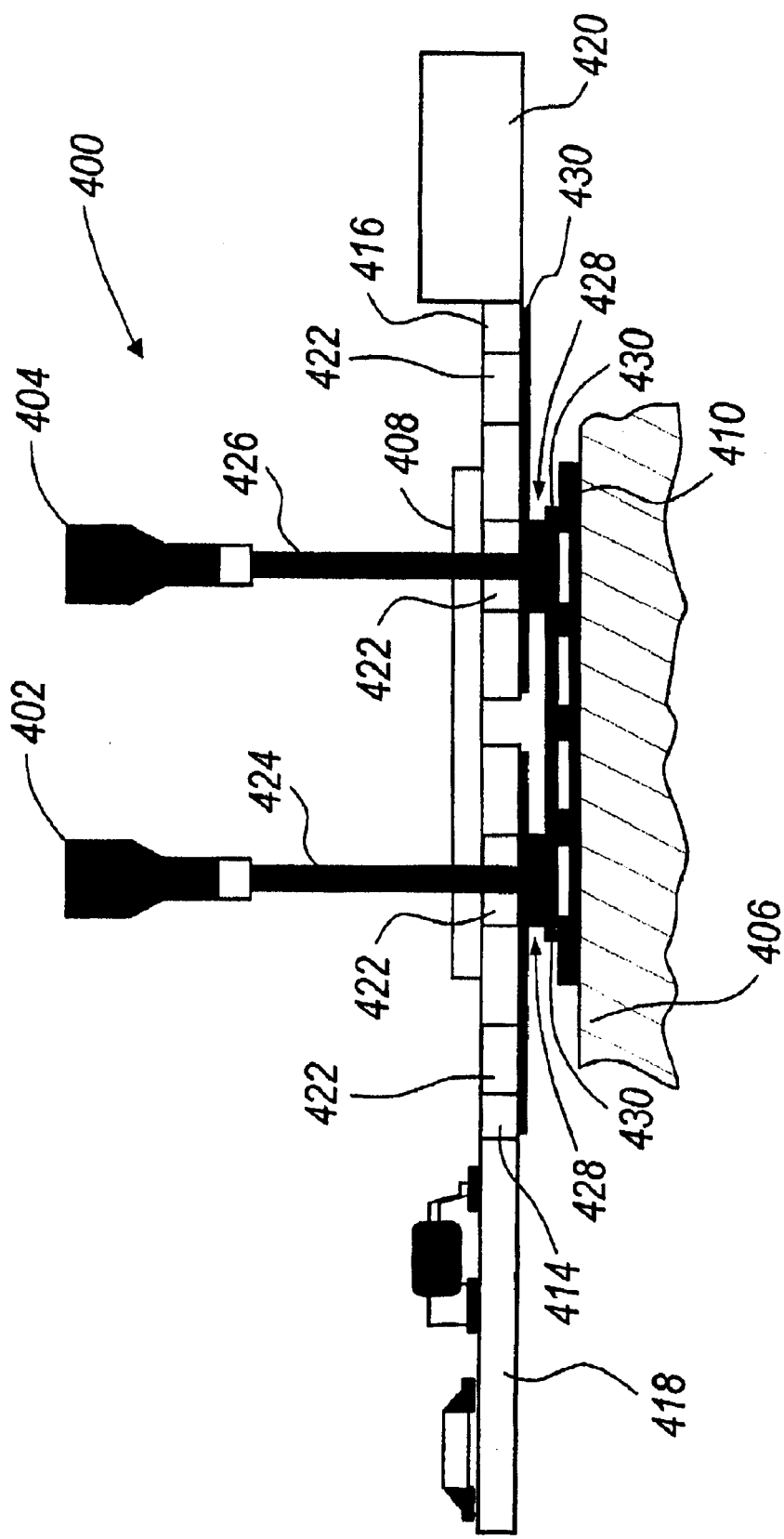
FIG. 8 illustrates a system and method for soldering or reflowing solder to electrically interconnect flat flex cables, in accordance with the present invention.

Referring now to FIG. 8, a system and method for soldering flat flex cables and more specifically flat flex patches to flat flex cables is illustrated, in accordance with the present invention. Soldering apparatus 400 includes, in one embodiment, a pair of diode lasers 402 and 404, a work surface 406 and a hold down fixture 408. In operation a flat flex repair patch 410, constructed in a similar manner as described above, is placed on the work surface 406. Flat flex cable portions 412 and 414 are then placed on top of the flat flex repair patch 410. Flat flex cables 414 and 416 may have circuit boards 418 and sensors 420 attached thereto, as previously described. A plurality of light colored or clear regions 422 are disposed along flat flex cables 414 and 416 to allow the laser light beam 424 and 426 to penetrate the substrate of flat flex cables 414 and 416 and liquefy the solder paste 428. Since the laser light generated by laser diodes 402 and 404 is not absorbed by a light colored or clear objects substantially all of the light passes through the flat flex cable light regions 422 and is absorbed by conductive traces 430 and solder paste 428. Therefore, the present invention provides a system and method for electrically interconnecting flat flex cable using laser light generated by diode lasers. Of course, hold down fixture 408 is similarly light colored or clear to allow laser light to pass therethrough.

With reference to FIGS. 9a–9l, a method for soldering flexible flat cable (FFC) having exposed conductors 502 is illustrated. Typically, a plurality of conductors 502 are attached to FFC 504 for transmitting electrical signals therethrough. However, a difficulty that arises when two separate portions of FFC 504 are required to be joined. The method of the present invention solves this difficulty by first exposing conductors 502 such that conductors 502 extend beyond FFC 504 creating an extended conductor portion 503. A plastic or other nonconductive strip 506 is then placed underneath extended conductor portion 503 of conductors 502. Strip 506 may include an adhesive to facilitate bonding of the strip to conductors 502. A plan view shown in FIG. 9c shows the plastic strip 506 bonded to conductors 502. A cross-sectional view of the assembly shown in FIG. 9c is illustrated in FIG. 9d.

Next, a solder paste or core solder wire or solder pre-form 508 is placed over top of and across the plurality of conductors 502, as illustrated in a plan view in FIG. 9e. As illustrated in FIG. 9f, which is a cross-sectional view through the assembly shown in FIG. 9e, solder 508 is placed across top surfaces 510 of each of the plurality of conductors 502.

With specific reference now to FIG. 9g, a plan view of two portions 512 and 514 of FFC 504 are assembled. FFC portion 512 is positioned such that the conductors 502 on portion 512 meet a plurality of conductors 516 on portion 514, as illustrated in cross-sectional view in FIG. 9h. Thus, solder 508 is disposed between conductors 502 and conductors 516. Next, a clear plastic strip 518 is applied across lap joint 520 to electrically isolate the exposed conductors 502 and 516.

As illustrated in FIG. 9i, a plan view of FFC portions 512 and 514 having a lap joint 520 is illustrated. In operation, conductors 516 and 502 are electrically interconnected using solder 508 by reflowing the solder. Solder 508 is reflowed by in irradiative lap joint 520 with laser light from a laser the laser emits a beam spot 522. The laser and beam spot 522 is rastered transversely across lap joint 520, in a direction indicated by arrow d. As illustrated in plan view in FIG. 9k, the solder 508 after reflow is disposed only between conductors 502 and 516 and does not traverse the substrate and interconnect adjacent conductor pairs 502, 516. Therefore, the present invention provides an electrical interconnection of conductors 502 and 516 without shorting occurring between adjacent conductor pairs. The finished lap joint 520 (after solder reflow) is further illustrated in a cross-sectional view of FIG. 9l.

Figure 10A:
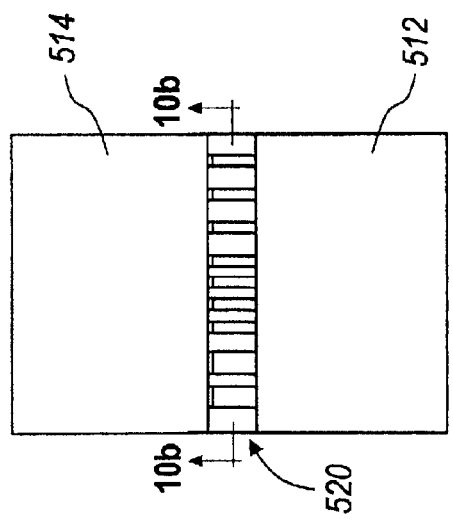
FIGS. 10a–10b are a plan view of a flat flex cable and a cross-sectional view through a lap joint, in accordance with the present invention.
Figure 10B:
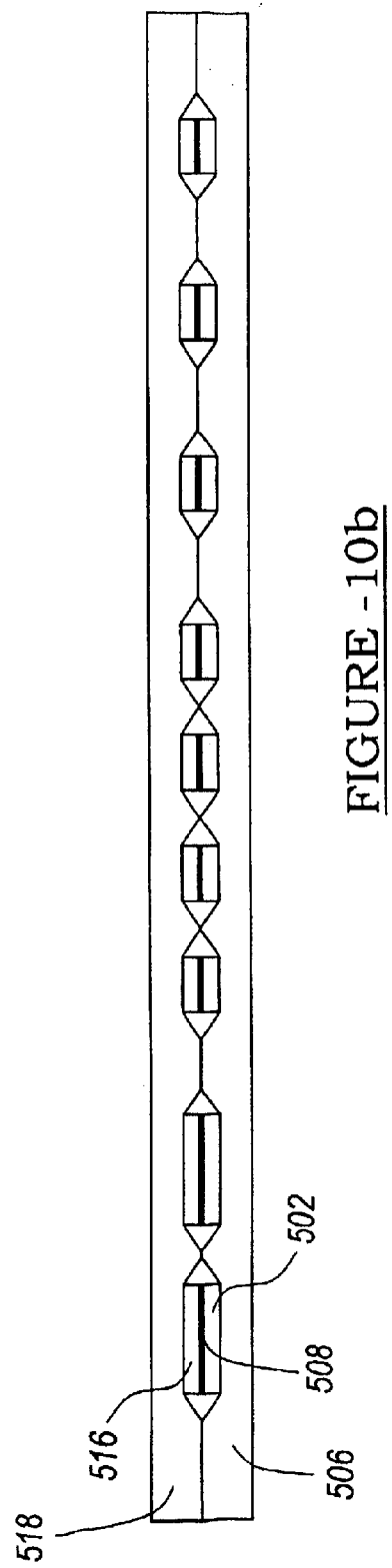

Referring now to FIGS. 10a and 10b, a plan view of flexible flat cable portions 512 and 514 and a cross-sectional view through lap joint 520 are illustrated, in accordance with the present invention. As shown in FIG. 10b, plastic strips 506 and 518 are welded together by the laser and laser beam spot 522 and conductors 502 and 516 are sealed therebetween. Thus, the present invention provides an electrically isolated lap joint 520.

Figure 11:
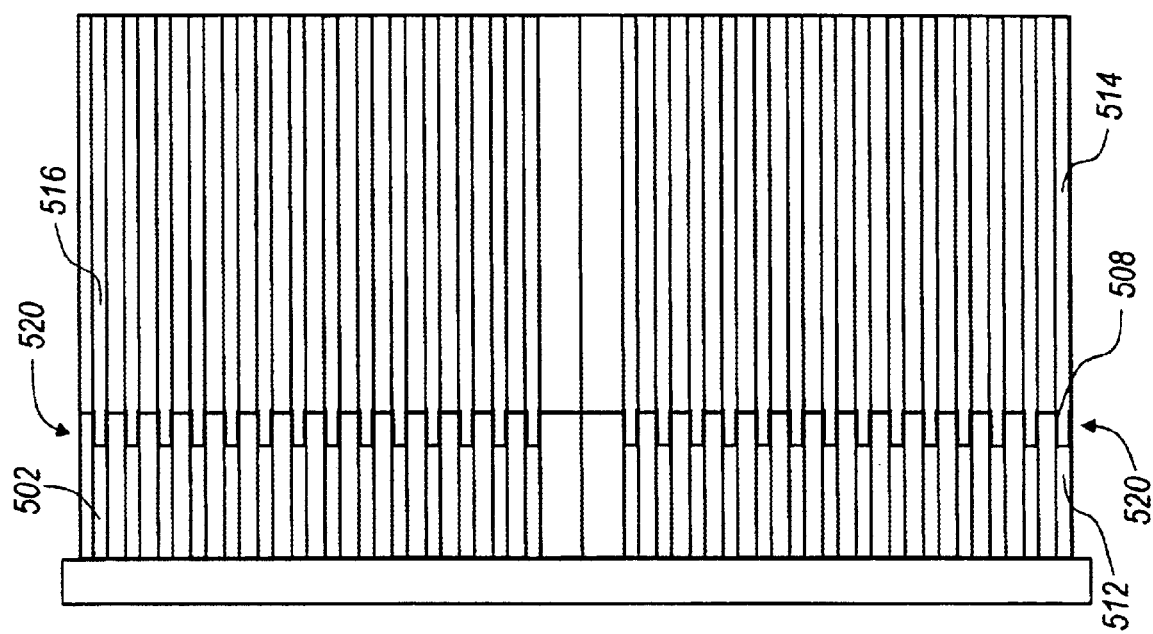
FIG. 11 is a plan view of a lap joint and flat flex cable after solder has been reflowed, in accordance with the present invention.

Referring now to FIG. 11, a plan view of a lap joint after solder has been reflowed is illustrated, in accordance with the present invention. As illustrated, the solder is disposed along the conductor traces and does not exist between adjacent conductors or traces. Thus, the present invention has many advantages and benefits of the prior art. For example, solder having a variety of configurations and consistencies may be placed transversely across the plurality of conductors and then reflowed to form an electrical joint only between mating pairs of conductors.

Figure 12A:
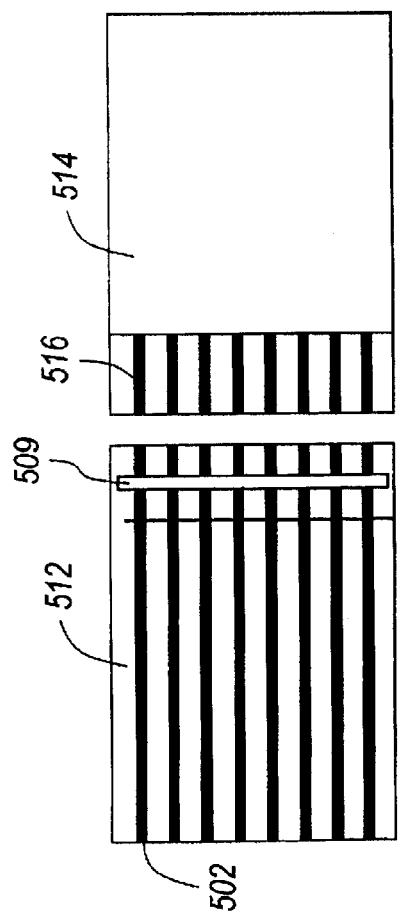
FIG. 12a is a plan view of a flat flex cable wherein solder paste has been applied transversely across the conductors, in accordance with the present invention.

For example, solder paste 509 may be applied transversely across the conductors as shown in plan view in FIG. 12a. In another embodiment of the present invention, a pre-formed solder sheet 515 having the different shapes such as those illustrated in FIG. 12b may be placed transversely across conductors 502. Further, in another embodiment of the present invention, solder wire core is placed transversely across conductors 502 to form an electrical interconnect with conductors 516.

Figure 12C:
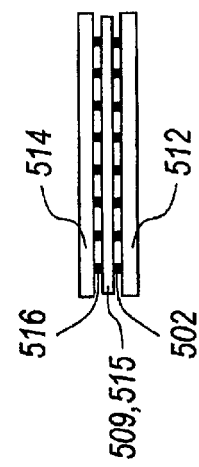
FIG. 12c is a cross-sectional view of the flate flex cable wherein a pre-formed solder sheet having the solder formed in different shapes is applied transversely across the conductors, in accordance with the present invention.
Figure 12B:
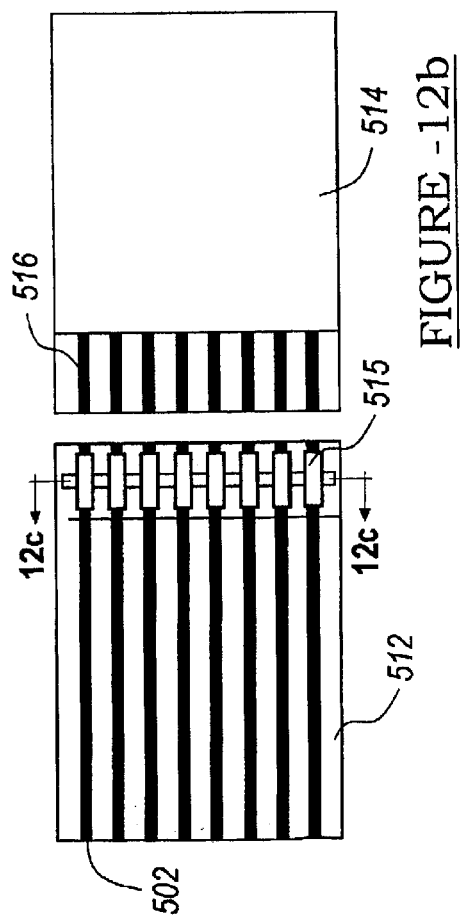
FIG. 12b is a plan view of a flat flex cable wherein a pre-formed solder sheet having the solder formed in different shapes is applied transversely across the conductors, in accordance with the present invention.

The positioning of solder paste 509, solder wire core, and/or pre-formed solder sheet 515 is further illustrated in a cross-sectional view, in FIG. 12c, through a lap joint formed by overlapping FFC 512 with FFC 514. Solder 509, 515 upon reflow will exist only between opposing conductor pairs 502, 516. Thus, the present invention provides in the foregoing embodiments and in other embodiments, systems and methods for repairing flat flex (or flexible) cable in an easy and efficient manner.

The foregoing discussion discloses and describes a preferred embodiment of the invention. One skilled in the art will readily recognize from such discussion, and from the accompanying drawings and claims, that changes and modifications can be made to the invention without departing from the true spirit and fair scope of the invention as defined in the following claims.

What is claimed is:

1. A repairable electrical system for conducting electrical signals to and from electronic devices, the system comprising:

a first and second flexible circuit substrate having a cut zone and a repair zone, wherein the first flexible circuit substrate is electrically connected to a first electronic device and the second flexible circuit substrate is electrically connected to a second electronic device;

at least one electrical conductor supported on each of the first and second flexible circuit substrates, wherein the electrical conductor carries the electrical signals; and a repair patch having at least one electrical conductor for electrically interconnecting at least one repair zone on the first flexible circuit substrate to at least one repair zone on the second flexible circuit substrate, and wherein the flexible circuit substrate and the repair patch includes a plurality of alignment apertures for aligning the first flexible circuit substrate, the second flexible circuit substrate and repair patch to ensure alignment and positioning of conductors on the first and second flexible circuit substrate with conductors on the repair patch.

2. The system of claim 1 further comprising a solder pre-form disposed on the conductor.

3. The system of claim 2 wherein the solder pre-form is disposed within the repair zone.

4. The system of claim 1 wherein the flexible circuit substrate includes a plurality of conductors.

5. The system of claim 1 wherein the conductors are exposed within the repair zones.

6. The system of claim 2 wherein the solder pre-form is a eutectic solder composition having 63% tin and 37% lead.

7. The system of claim 2 wherein the solder pre-form is comprised of a lead free solder formulation.

8. The system of claim 1 wherein the repair patch includes multiple repair zones for mating with and electrically interconnecting to repair zones on the first and second flexible circuit substrates.

9. The system of claim 1 wherein the repair patch is electrically interconnected to the first and second flexible circuit substrates using a diode laser.

10. The system of claim 1 wherein a solder paste is applied transversely across the electrical conductors.

11. A method for repairing flexible circuits having a flexible substrate, the method comprising:

locating a repair zone on the flexible substrate;

cutting along a cut line located within the repair zone to separate the flexible substrate into a first and second flexible substrate;

positioning a repair patch within the repair zone on each of the first and second the flexible substrates;

applying pressure to the repair patch over the repair zones; and soldering the repair patch to the first and second flexible substrate within each of the repair zones to form an electrically conductive joint.

12. The method of claim 11 wherein applying pressure further comprises actuating a hold down fixture restrict movement of the flexible substrate.

13. The method of claim 11 further comprising applying a solder pre-form transversally across the flexible substrate.

14. The method of claim 11 further comprising applying a solder paste transversally across the flexible substrate.

15. The method of claim 11 further comprising applying a solder core wire transversally across the flexible substrate.

16. The method of claim 11 wherein soldering further comprises emitting a laser light to reflow solder to electrically interconnect the first and second portions.

17. A method for repairing flexible circuits having a flexible substrate, the method comprising:

locating a repair zone on the flexible substrate;

cutting along a cut line located within the repair zone to separate the flexible substrate into a first and second flexible substrate;

positioning a repair patch within the repair zone on each of the first and second the flexible substrates;

applying pressure to the repair patch over the repair zones; and emitting a laser light beam to reflow solder to form an electrically conductive joint, within each of the repair zones, between the repair patch and the first flexible substrate and the second flexible substrate.

18. The method of claim 17 wherein applying pressure further comprises actuating a hold down fixture restrict movement of the flexible substrate.

19. The method of claim 17 further comprising applying a solder pre-form transversally across the flexible substrate.

20. The method of claim 17 further comprising applying a solder paste transversally across the flexible substrate.

21. The method of claim 17 further comprising applying a solder core wire transversally across the flexible substrate.

* * * * *